(12) United States Patent
Bicknell

(10) Patent No.: US 8,154,880 B1
(45) Date of Patent: Apr. 10, 2012

(54) METHOD AND APPARATUS FOR ACTIVE LINE INTERFACE ISOLATION

(75) Inventor: Jeremy Bicknell, Santa Clara, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 721 days.

(21) Appl. No.: 12/253,891

(22) Filed: Oct. 17, 2008

(51) Int. Cl.
*H05K 7/00* (2006.01)

(52) U.S. Cl. ........ 361/770; 361/735; 361/742; 361/760; 361/778; 361/803

(58) Field of Classification Search ............. 361/728, 361/729, 735–737, 742, 760, 767, 770, 778, 361/790, 792, 803, 804
See application file for complete search history.

(56) References Cited

U.S. PATENT DOCUMENTS

| | | | |
|---|---|---|---|
| 2004/0051119 A1* | 3/2004 | Kikuma et al. | 257/200 |
| 2005/0112842 A1* | 5/2005 | Kang et al. | 438/455 |
| 2006/0076690 A1* | 4/2006 | Khandros et al. | 257/777 |

* cited by examiner

*Primary Examiner* — Hoa C Nguyen
(74) *Attorney, Agent, or Firm* — Heimlich Law, PC; Alan Heimlich, Esq.

(57) ABSTRACT

A method and apparatus for active line interface isolation have been described.

3 Claims, 16 Drawing Sheets

METHOD AND APPARATUS FOR ACTIVE LINE INTERFACE ISOLATION

FIELD OF THE INVENTION

The present invention pertains to communication interfaces. More particularly, the present invention relates to a method and apparatus for active line interface isolation.

BACKGROUND OF THE INVENTION

Line interface units (LIU) are used for interfacing between a communication medium (often referred to as a line) and a communication device. For example, in wired Ethernet a LIU may be situated between a system ASIC (Application Specific Integrated Circuit) which is a communications device and a set of magnetics which are attached directly to a wired line. FIG. 3 illustrates, generally at 300, a board 302 having a system ASIC 304 connected via 305 to a LIU (often referred to as a PHY (Physical layer device)) 306 which in this example is connected via 307 to magnetics 308 which interface to line 309. The magnetics provide isolation.

A LIU (such as illustrated by FIG. 3) uses powered, discrete mixed signal semiconductor ICs (Integrated Circuits) mounted on printed circuit boards and connected to passive magnetics modules and line transformers.

If the semiconductor technology changes, then a different transformer ratio is needed. If a board containing this line transformer is already installed in the field, then it cannot be easily replaced. This presents a problem.

There may be unnecessary cost and complexity of a total solution which includes separate transformers, protection components, bypass capacitors and termination resistors. This presents a problem.

High density is possible in the ICs (e.g. 32 channels), however, the same level of density is limited in the line transformers, and the cost of higher density ICs may lead to an overall increase in per-port cost. This presents a problem.

Compliance of the complete line interface solution to specifications is not assured because IC, protection, and transformers are delivered to the customer by at least two different suppliers. This presents a problem.

The line interface IC is connected to power, digital logic of system level chip, and analog signal at the transformer. One side of the transformer is connected to the IC analog signal, the other side is connected to a twisted pair or cable which is in turn susceptible to voltage spikes and other interference. If power is lost to the IC, then basic operation of the interface, including fault reporting, is no longer possible. If the transformer is located on a different circuit board from the IC and the two parts are connected using a connector, a break in the connection between them will result in a failure that cannot easily be detected and traced. This presents problems.

A Y-cable arrangement (such as illustrated by FIG. 4) uses a bulky series of connectors and cards to achieve redundancy.

For example, in FIG. 4, generally at 400 is shown one such approach. At 401 is a twisted pair, at 402 a connector, at 403 the wires leading to connectors 404 and 406 going respectively to 410 Primary Line Card and 412 Backup Line Card. Isolation switches as ganged by 411 are shown. Not shown is one or more ASICs to the left of each line card.

FIG. 5 illustrates a current approach to redundancy, generally at 500, which shows separate processors. At 502 is processor #1, and at 504 is processor #2.

BRIEF DESCRIPTION OF THE DRAWINGS

The invention is illustrated by way of example and not limitation in the figures of the accompanying drawings in which.

SUMMARY OF THE INVENTION

Figure 1:
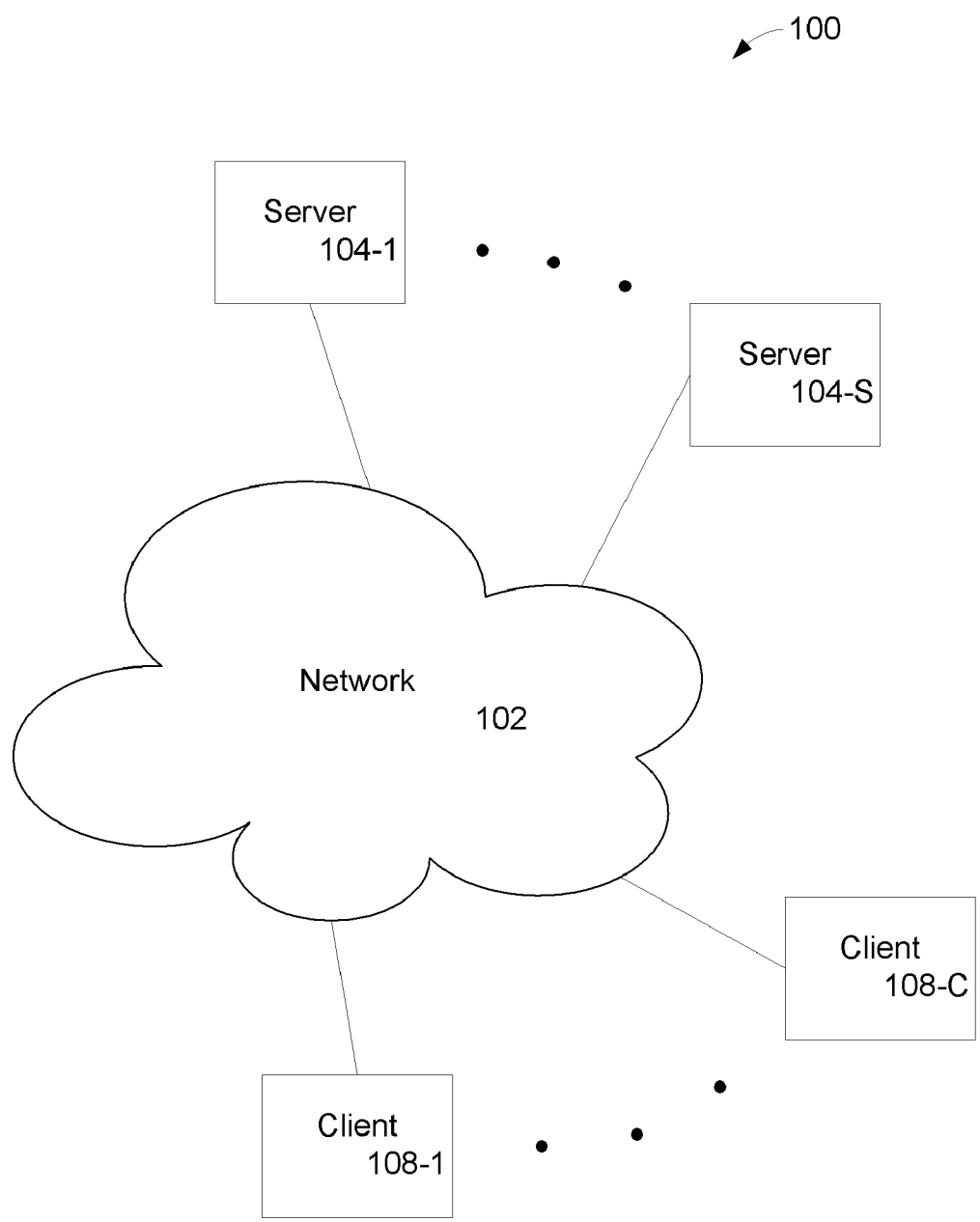
FIG. 1 illustrates a network environment in which the method and apparatus of the invention may be implemented.

Applicant(s) hereby submit that this Summary of the Invention complies with applicable CN (China i.e. SIPO) standards. All claims are literally copied here.

1. A method comprising:
   mounting a first unit having a plurality of connection pads on a substrate having a plurality of connection pads;
   mounting on said first unit a spacer;
   mounting on said spacer a second unit having a plurality of connection pads.

2. The method of claim 1 further comprising:
   creating a first connection from a one of said plurality of connection pads on said substrate to a one of said plurality of connection pads on said first unit;
   creating a second connection from said one of said plurality of connection pads on said first unit to a one of said plurality of connection pads on said second unit; and
   creating a third connection from said one of said plurality of connection pads on said second unit to said one of said plurality of connection pads on said substrate.

3. An apparatus comprising:
   a first unit having a back side and a connection side, said back side fixedly attached to a substrate, said substrate having connection points;
   a spacer having a first side and a second side, said first side fixedly attached to said first unit connection side;
   a second unit having a back side and a connection side, said back side fixedly attached to said spacer second side;
   a first wire having a proximate end and a distal end, wherein said first wire proximate end is electrically attached to one of said substrate connection points and said first wire distal end is electrically attached to said first unit connection side;
   a second wire having a proximate end and a distal end, wherein said second wire proximate end is electrically attached to said first unit connection side and said second wire distal end is electrically attached to said second unit connection side; and a third wire having a proximate end and a distal end, wherein said third wire proximate end is electrically attached to said second unit connection side and said third wire distal end is electrically attached to said one of said substrate connection points.

4. The apparatus of claim 3 wherein said first wire, said second wire, and said third wire are a single electrical node.

5. An apparatus comprising:

a first block having a transmit input, a transmit output, a receive input, a receive output, and a transmit control input, said transmit input capable of being coupled to receive an input, said transmit output capable of being coupled to transmit an output, said receive input capable of being coupled to receive an input, and said receive output capable of being coupled to transmit an output;

a second block having a transmit input, a transmit output, a receive input, a receive output, and a transmit control input, said transmit input capable of being coupled to receive an input, said transmit output capable of being coupled to transmit an output, said receive input capable of being coupled to receive an input, and said receive output capable of being coupled to transmit an output; and said first block said transmit input operatively coupled to said second block said transmit control input and said second block said transmit input operatively coupled to said first block said transmit control input.

6. An apparatus comprising:

a single package communications interface having a plurality of transmit connections, a plurality of receive connections, and a plurality of digital connections;

a plurality of receive channels operatively coupled to said plurality of receive connections;

a plurality of transmit channels operatively coupled to said plurality of transmit connections; and an integrated circuit operatively coupled to said plurality of digital connections.

7. The apparatus of claim 6 further comprising one or more transformer coils operatively coupled to said plurality of transmit channels.

8. The apparatus of claim 6 further comprising one or more capacitors operatively coupled to said plurality of receive channels.

9. The apparatus of claim 6 further comprising an optical cable light emitting device operatively coupled to said transmit channels 10. The apparatus of claim 6 further comprising an optical cable light detection device operatively coupled to said plurality of receive channels.

DETAILED DESCRIPTION

This design, as exemplified in various embodiments of the invention, illustrates a method and apparatus for active line interface isolation.

To illustrate the method and apparatus of the current invention, reference to one embodiment or specific embodiments may be used to describe the invention. The invention is not so limited and one of skill in the art will appreciate that the approach and techniques described may be used for arbitration and allocation of resources in general. Nor is the invention limited to electrical circuits, one of skill in the art will appreciate that the invention may be practiced in other ranges of wavelength, for example, optical.

Figure 6:
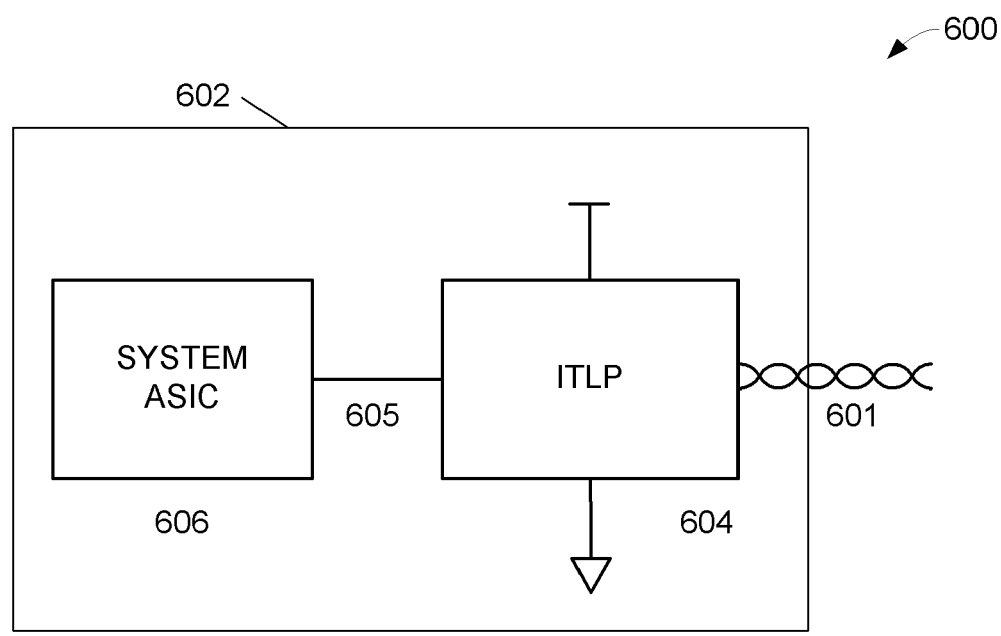
FIG. 6 illustrates one embodiment of the invention.

FIG. 6 illustrates, generally at 600, one embodiment of the invention. At 601 is a twisted pair, at 602 a line card having an interface 604 ITLP (integrated transformer liu/phy) to the twisted pair 601 and an output 605 to a system ASIC 606.

Figure 7:
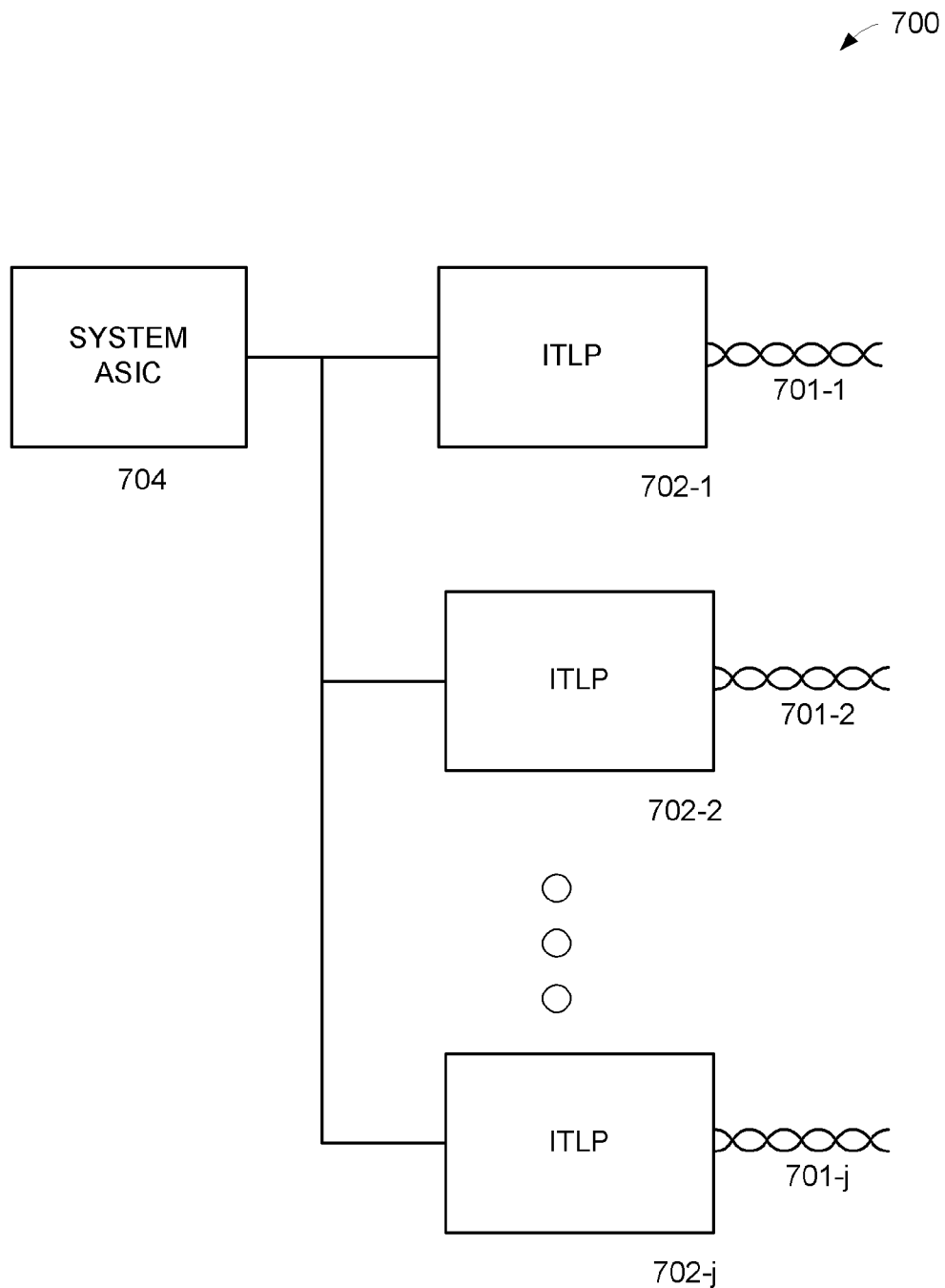
FIG. 7 illustrates one embodiment of the invention showing multiple channels.

FIG. 7 illustrates, generally at 700, one embodiment of the invention. At 701-1, 701-2, to 701-j are j twisted pairs (also called communication channels) going respectively to ITLP blocks 702-1, 702-2, to 702-j respectively with the outputs of 702-1, 702-2, to 702-j going to System ASIC 704. In one embodiment of the invention the System ASIC 704 is able to support 32 or more ITLPs. Supporting multiple ITLP units results in increased density on, for example, a line card.

Figure 8:
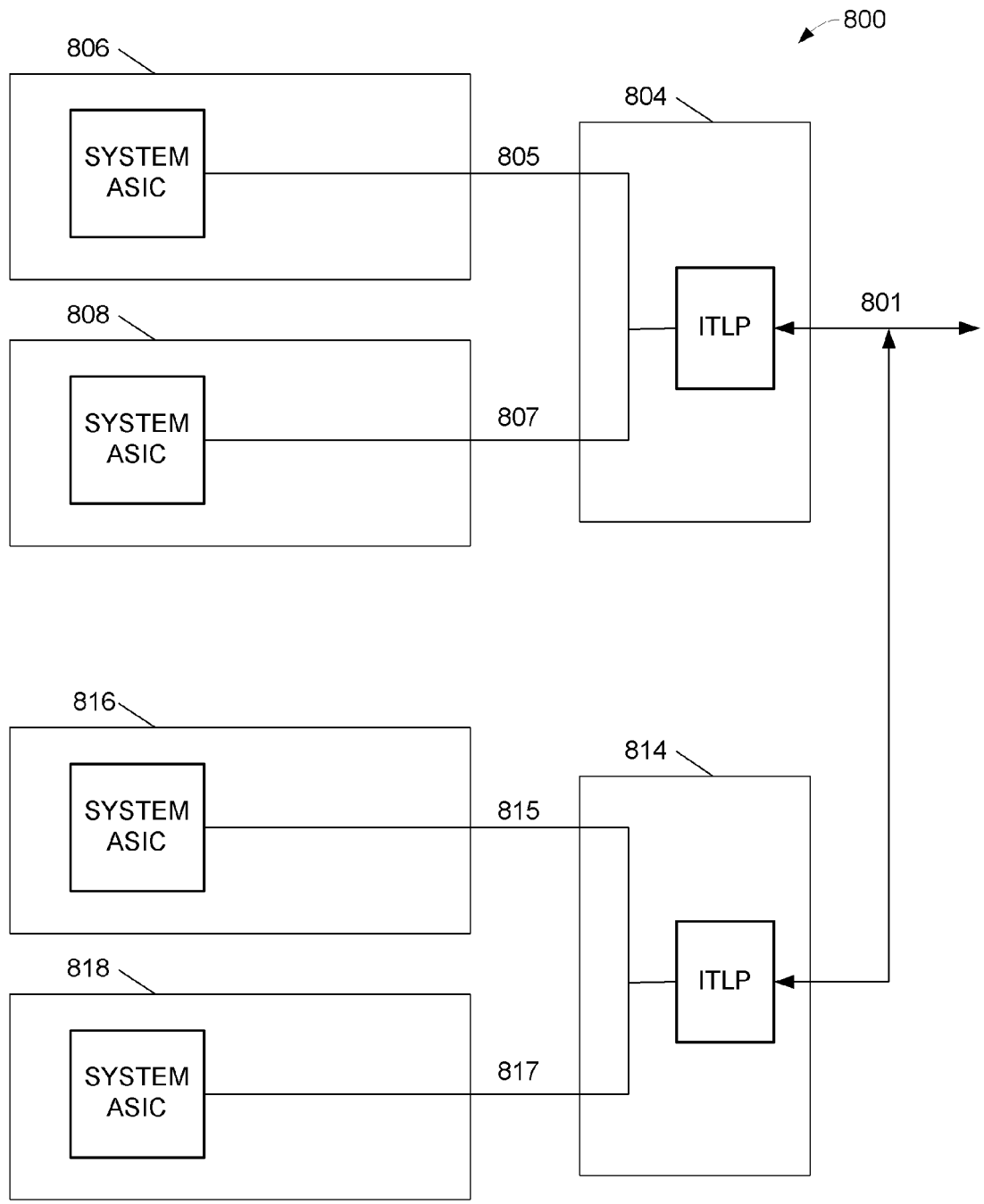
FIG. 8 illustrates one embodiment of the invention showing major blocks and redundancy.

FIG. 8 illustrates, generally at 800, an embodiment of the invention. At 801 is a communications channel which is in communication with blocks 804 and 814. Block 804 is in communication via links 805 and 807 with line cards having a system ASIC 806 and 808. Block 814 is in communication via links 815 and 817 with line cards having a system ASIC 816 and 818.

In one embodiment, as illustrated in FIG. 8, redundancy is achieved for a group of line cards attached to a common communication channel interface block. For example communication channel interface block 804 may provide communications to both 806 a master line card, and 808 a backup line card. In this embodiment, should master line card 806 fail, then backup line card 808 may continue communicating.

In one embodiment, as illustrated in FIG. 8, communication channel interface block 804 may be powered by power provided by the communications channel 801. For example, if communications channel 801 is Ethernet then 804 may be powered via POE (Power Over Ethernet).

In one embodiment, as illustrated in FIG. 8, redundancy is achieved for groups of line cards attached to different communication channel interface blocks. For example communication channel interface block 804 may provide communications to both 806 a master line card, and 808 a master line card. Communication channel interface block 814 may provide communications to both 816 a backup line card, and 818 a backup line card. In this embodiment, for example, should communication channel interface block 804 fail not allowing 806 or 808 to communicate, then communications channel interface 814 and backup cards 816 and 818 may continue communicating.

One of skill in the art will appreciate that other combinations are also possible. For example a backup may not need as many line cards as a regular communications channel.

Figure 9:
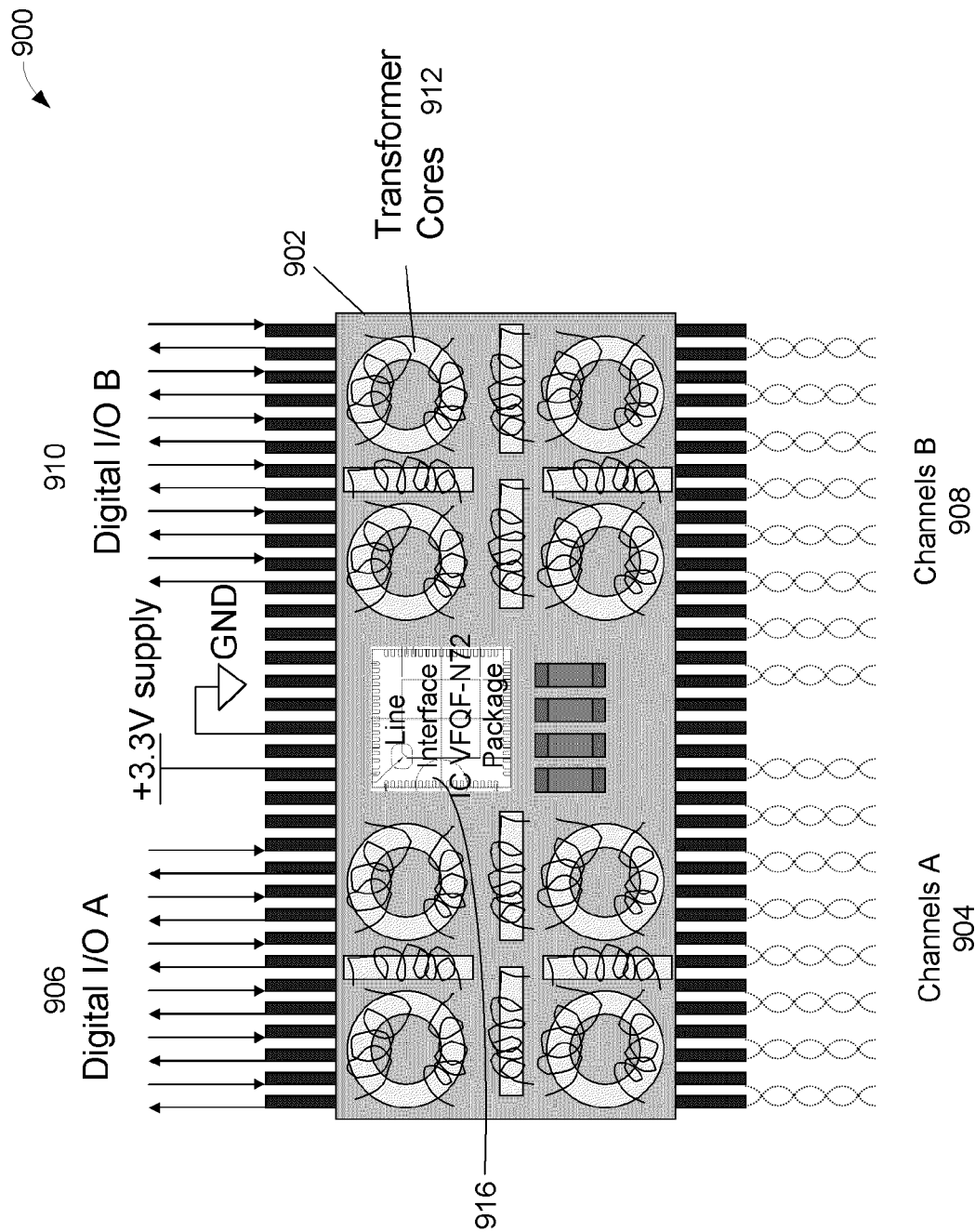
FIG. 9 illustrates one embodiment of the invention showing a package.

FIG. 9 illustrates, generally at 900, one embodiment of the invention. At 902 is a single package communications interface block which has eight Channels A 904, eight Channels B 908 and respective outputs Digital I/O A 906 and Digital I/O B 910. As illustrated Digital I/O A 906 and Digital I/O B 910 have six groups each of I/O. If Channels A 904 and Channels B 908 are configured as Tx/Rx pairs then Digital I/O A 906 and Digital I/O B 910 have two extra I/O groups that may be used, for example, to configure the communications interface block 902 or for other signaling functions or status. Also shown is a supply (+3.3V) and ground GND. Communications interface block 902 has among other things transformer coils as exemplified at 912 and a Line Interface 916 (an integrated circuit), which in this embodiment is shown in a IC VFQF-N72 Package. Line interface 916 is operatively coupled to Digital I/O A 906 and Digital I/O B 910 as well as transformer cores 912.

In one embodiment, as illustrated in FIG. 9, magnetic isolation (via transformer cores 912) is used in both the transmit (Tx) and receive (Rx) paths.

Figure 10:
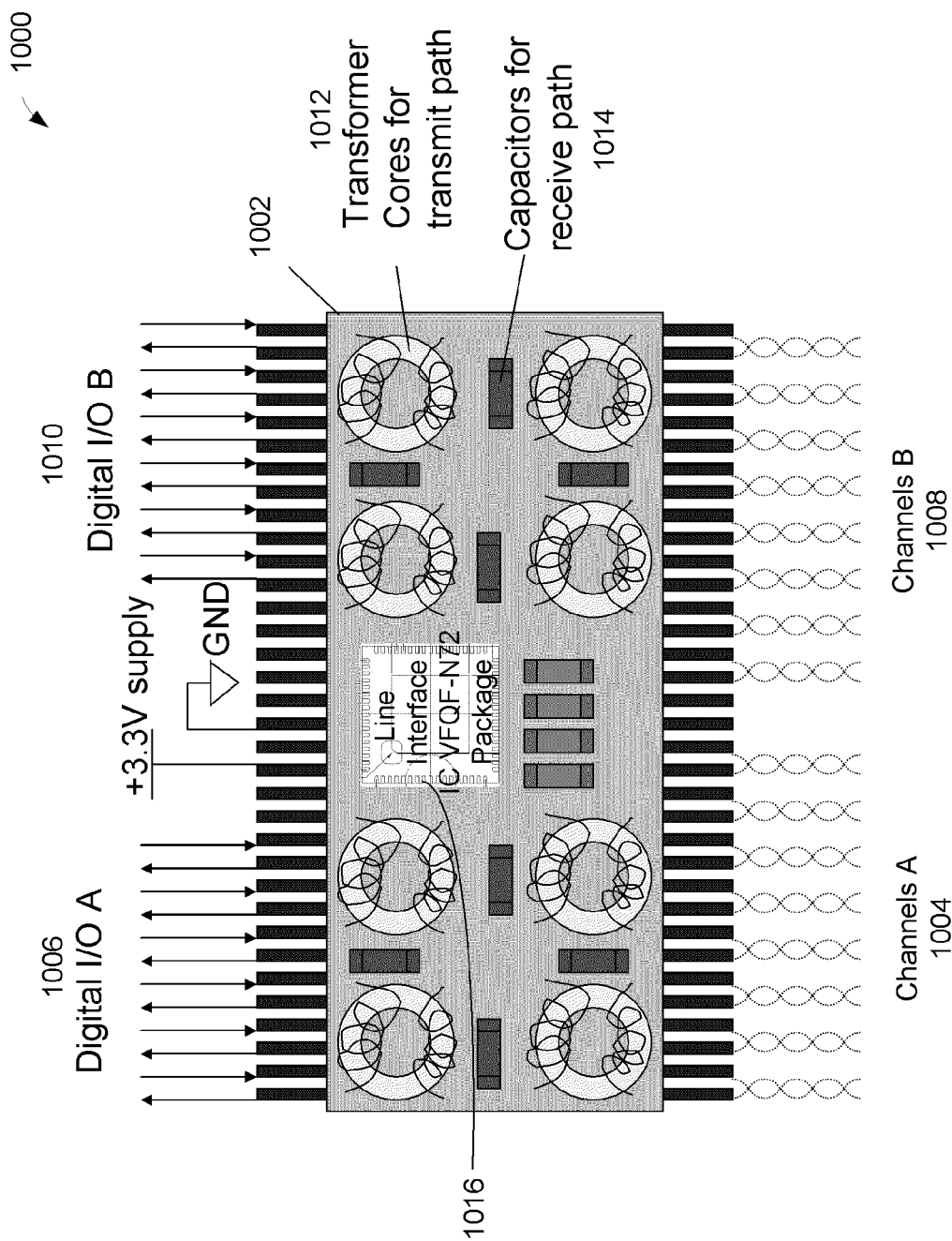
FIG. 10 illustrates one embodiment of the invention showing a package.

FIG. 10 illustrates, generally at 1000, one embodiment of the invention. At 1002 is a communications interface unit which has eight Channels A 1004, eight Channels B 1008 included within respective outputs Digital I/O A 1006 and Digital I/O B 1010. As illustrated Digital I/O A 1006 and Digital I/O B 1010 have six groups each of I/O. If Channels A 1004 and Channels B 1008 are configured as Tx/Rx pairs then Digital I/O A 1006 and Digital I/O B 1010 have two extra I/O groups that may be used, for example, to configure the communications interface unit 1002 or for other signaling functions or status. Also shown is a supply (+3.3V) and ground GND. Communications interface unit 1002 has among other things transformer coils as exemplified at 1012 for isolation of the transmit (Tx) paths, capacitors as exemplified at 1014 for isolation of receive (Rx) paths, and a Line Interface 1016, which in this embodiment is shown in a IC VFQF-N72 Package.

In one embodiment, as illustrated in FIG. 10, capacitive isolation in the receive path may allow for a smaller package for communications interface unit 1002.

Figure 11:
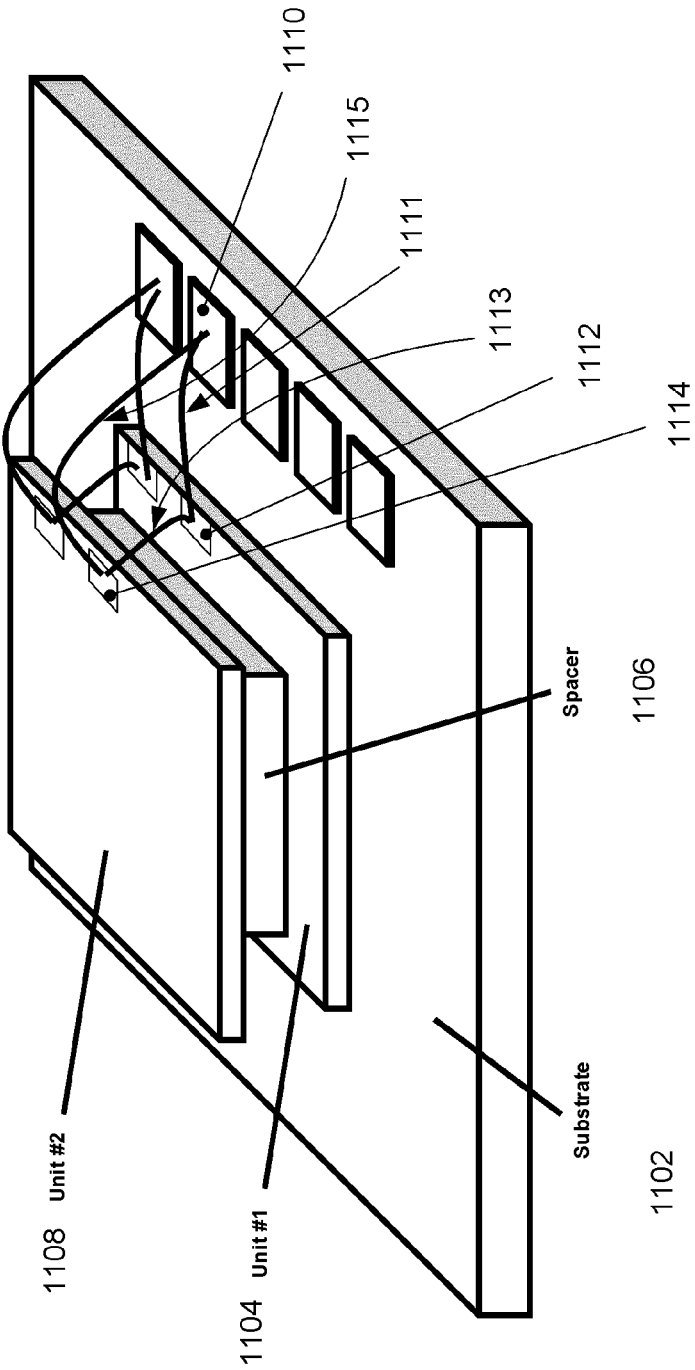
FIG. 11 illustrates one embodiment of the invention showing units and connections.

FIG. 11 illustrates, generally at 1100, one embodiment of the invention. At 1102 is a substrate (such as but not limited to ceramic, glass, etc.) upon which is attached unit #1 1104 (such as, but not limited to an IC die, a circuit board, etc.). At 1106 is a spacer between unit #1 1104 and unit #2 1108 (such as, but not limited to an IC die, a printed circuit board (PCB), a hybrid, etc.). At 1110 is a connection point situated on the substrate 1102. A connection point, such as shown at 1110, 1112, and 1114 may be, but are not limited to, a die pad, a PCB land, a lead, etc. At 1111 is a first connection between connection point 1110 and connection point 1112 located on unit #1 1104. At 1113 is a second connection between connection point 1112 and connection point 1114 located on unit #2 1108. At 1115 is a third between connection point 1114 and connection point 1110.

One of skill in the art will appreciate that any one broken connection, such as 1111, 1113, or 1115, will still allow both units to operate. Additionally such an approach allows each unit to monitor the other unit.

The approach as illustrated generally at 1100 may be extended to handle more than two units.

Figure 12:
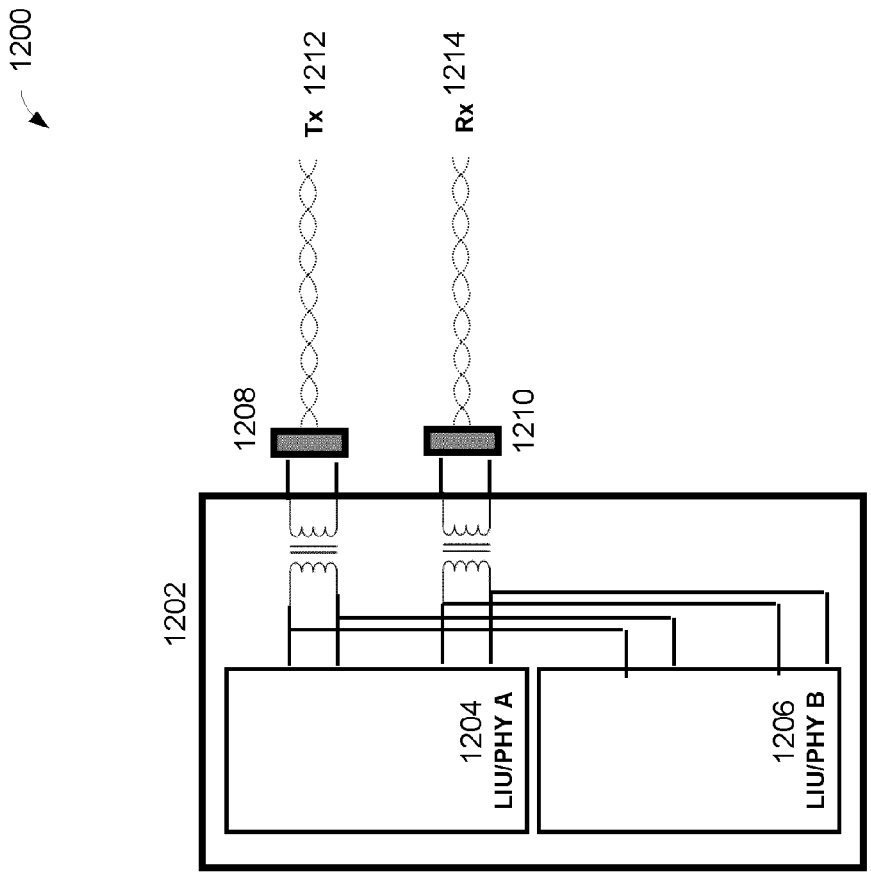
FIG. 12 illustrates one embodiment of the invention showing a parallel arrangement.

FIG. 12 illustrates, generally at 1200, one embodiment of the invention. At 1202 is a module having LIU/PHY A 1204 and LIU/PHY B 1206 which are shown in a parallel arrangement with transformers for Tx 1212 via connection 1208 and Rx 1214 via connection 1210.

In one embodiment, as generally illustrated in FIG. 12, module 1202 may be, for example, constructed as generally illustrated in FIG. 11.

Figure 13:
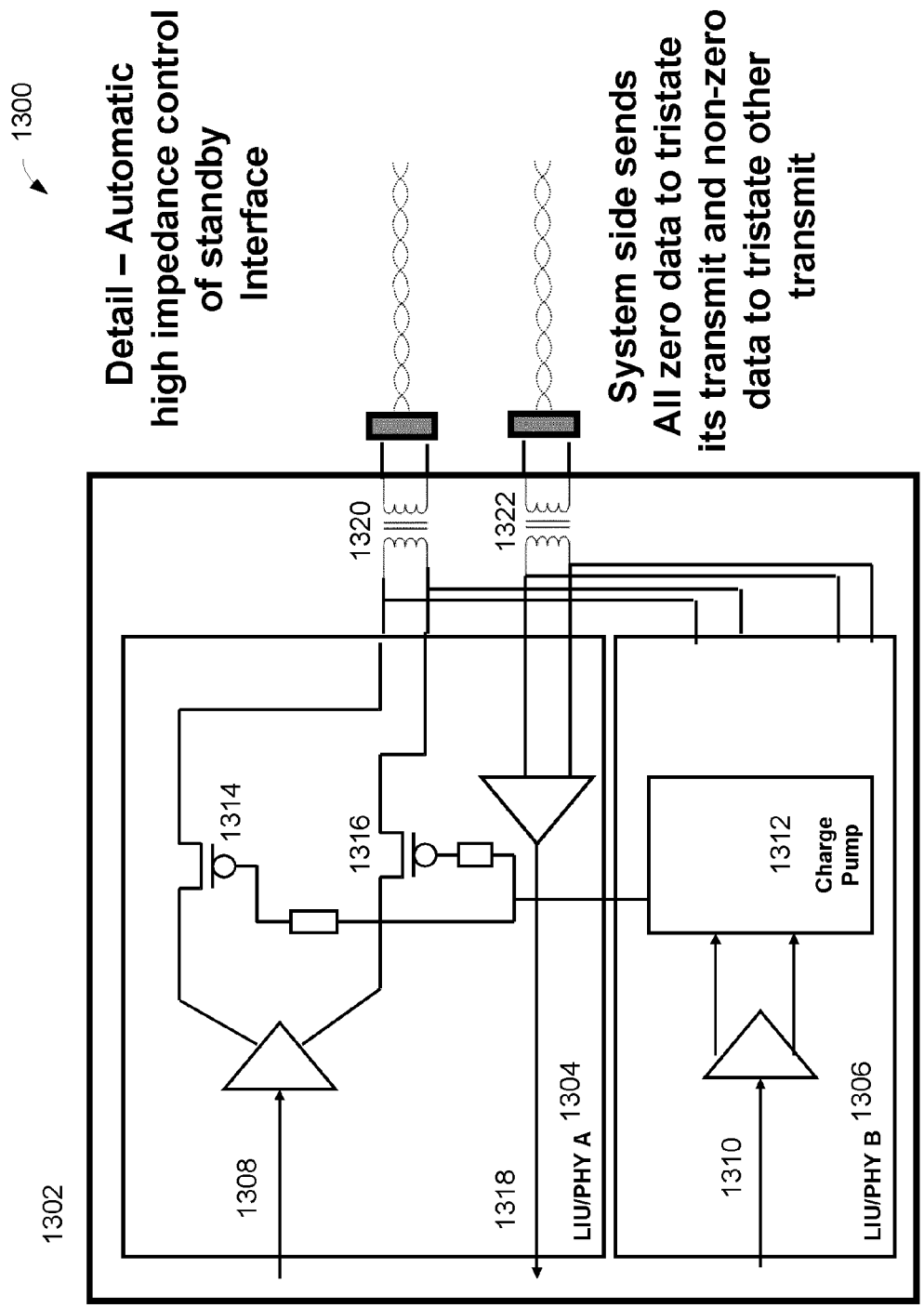
FIG. 13 illustrates one embodiment of the invention showing impedance control.

FIG. 13 illustrates, generally at 1300, one embodiment of the invention. At 1302 is a module having LIU/PHY A 1304 and LIU/PHY B 1306 which are shown in parallel arrangement with transformers 1320 and 1322. LIU/PHY A 1304 has a transmit input 1308, two pass transistors (acting as switches) 1314 and 1316 and a receive output 1318. LIU/PHY B 1306 has shown only a control circuit having an input 1310 which controls a charge pump 1312 which in turn controls pass transistors 1314 and 1316 located in LIU/PHY A 1304.

FIG. 13 illustrates in one embodiment automatic high impedance control of a standby interface. For example, in FIG. 13, for sake of illustration assume initially that transmit input 1308 is receiving a transmit signal which is transitioning between states (e.g. high/low). Assume that this transitioning transmit signal is also coupled to control circuit input 1310. The activity on 1310 causes the charge pump 1312 to generate signals to turn on transistors 1314 and 1316 thereby allowing a signal to be transmitted to 1320. In this case the transmitter is not in a high impedance state. Assume now that transmit input 1308 is receiving a transmit signal which is not transitioning between states (e.g. high or low). Assume that this non-transitioning transmit signal is also coupled to control circuit input 1310. The lack of activity on 1310 causes the charge pump 1312 to generate signals to turn off transistors 1314 and 1316 thereby prevent any signal to be transmitted to 1320. In this case the transmitter is in a high impedance state. Thus the impedance of the transmitter output may be controlled.

Not illustrated for sake of clarity in FIG. 13 is an embodiment where each LIU/PHY also has a charge pump and control circuitry as illustrated generally in FIG. 13 at 1306.

Figure 14:
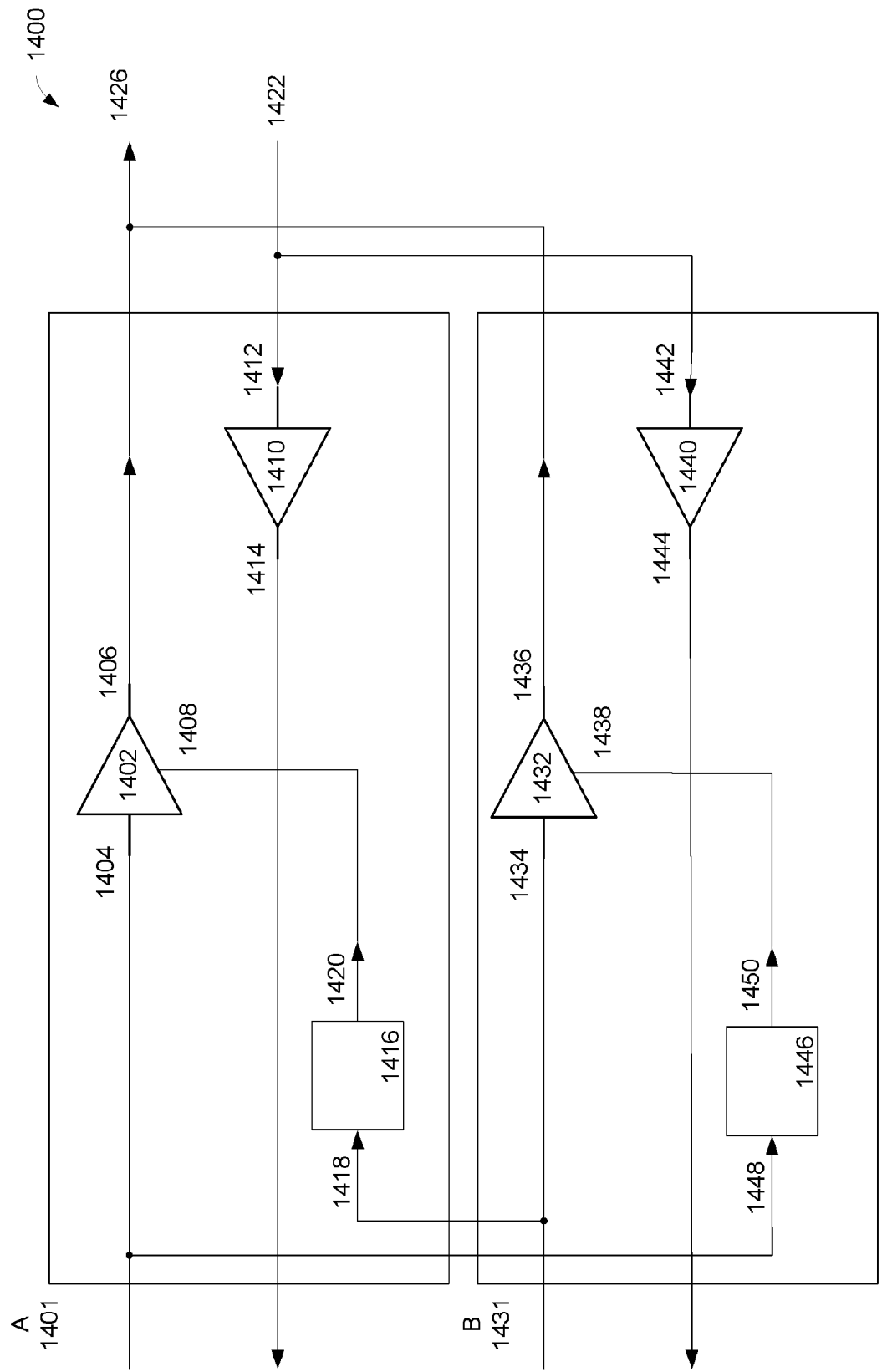
FIG. 14 illustrates one embodiment of the invention showing possible connection for redundancy and impedance control.

FIG. 14 shows, generally at 1400, in block form an arrangement for one embodiment of the invention where redundancy is present and where A or B sending data forces the other interface (i.e. B or A) to a high impedance state (also called hi-Z or tristate). Unit A 1401 receives an input via 1422 to input 1412 on receiver 1410 which has an output 1414 which may go to other circuitry. Unit B 1431 receives an input via 1422 to input 1442 on receiver 1440 which has an output 1444 which may go to another circuit. Unit A 1401 has a transmitter 1402 which receives input via 1404, has an output 1406, and a control input 1408 to control transmitter 1402 output impedance. Unit B 1431 has a transmitter 1432 which receives input via 1434, has an output 1436, and a control input 1438 to control transmitter 1432 output impedance.

In the embodiment illustrated in FIG. 14, unit B 1431 has a control circuit 1446 which has an output 1450 coupled to transmitter control input 1438, and an input 1448 coupled to unit A 1401 transmitter input 1404. Unit A 1401 has a control circuit 1416 which has an output 1420 coupled to transmitter control input 1408, and an input 1418 coupled to unit B 1431 transmitter input 1434.

In one embodiment of the invention as shown generally in FIG. 14, control circuits 1416 and 1446 operate in a mode where a toggling input signal (1418 and 1448 respectively) generates an output signal (1420 and 1450 respectively) which causes the output transmitter to which it is connected to enter a high impedance output state. For example if input 1404 is toggling then transmitter 1432's output is in a high impedance state. If input 1434 is toggling then transmitter 1402's output is in a high impedance state. In this mode of operation if unit A 1401 or unit B 1431 is sending data then the other transmitter output is in high impedance.

Figure 15:
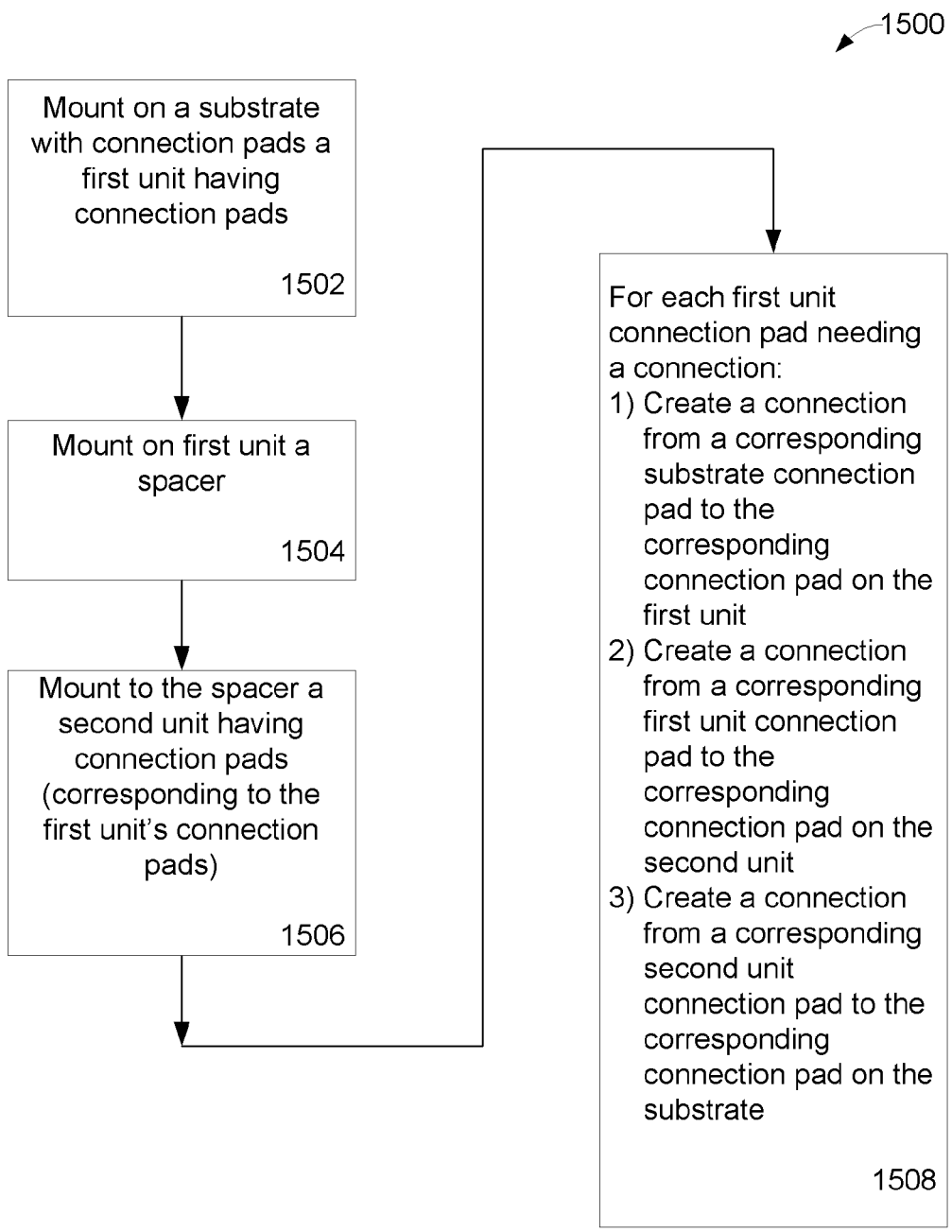
FIG. 15 illustrates one embodiment of the invention in flow chart form.

FIG. 15 illustrates, generally at 1500, in flow chart form one embodiment of the invention. At 1502 a first unit having connection pads, for example numbered A1 to A72, is mounted on a substrate having connection pads, for example numbered S1 to S100. At 1504 a spacer is mounted on the first unit and at 1506 a second unit having connection pads corresponding to the first unit, for example B1 to B72, is mounted on the spacer. At 1508 for each first unit connection pad needing a connection: 1) Create a connection from a corresponding substrate connection pad to the corresponding connection pad on the first unit; 2) Create a connection from a corresponding first unit connection pad to the corresponding connection pad on the second unit; and 3) Create a connection from a corresponding second unit connection pad to the corresponding connection pad on the substrate.

For example, assume the substrate has 100 pads numbered S1 to S100, the first unit has 72 pads numbered A1 to A72, and the second unit has 72 pads numbered B1 to B72. Assume further that the pads on the first unit and the second unit to be connected are only A10 through A60, and B10 through B60, and that they are to be connected to the respective substrate pads S10 through S60. The connections for pad 10 would then be S10 to A10, A10 to B10, and B10 to S10. This would be repeated for all 10 through 60 pads, thus ending with S60 to A60, A60 to B60, and B60 to S60.

While embodiments of the invention described above have illustrated it with respect to wired connections, the invention is not so limited. For example, optical communications may be used.

Figure 16:
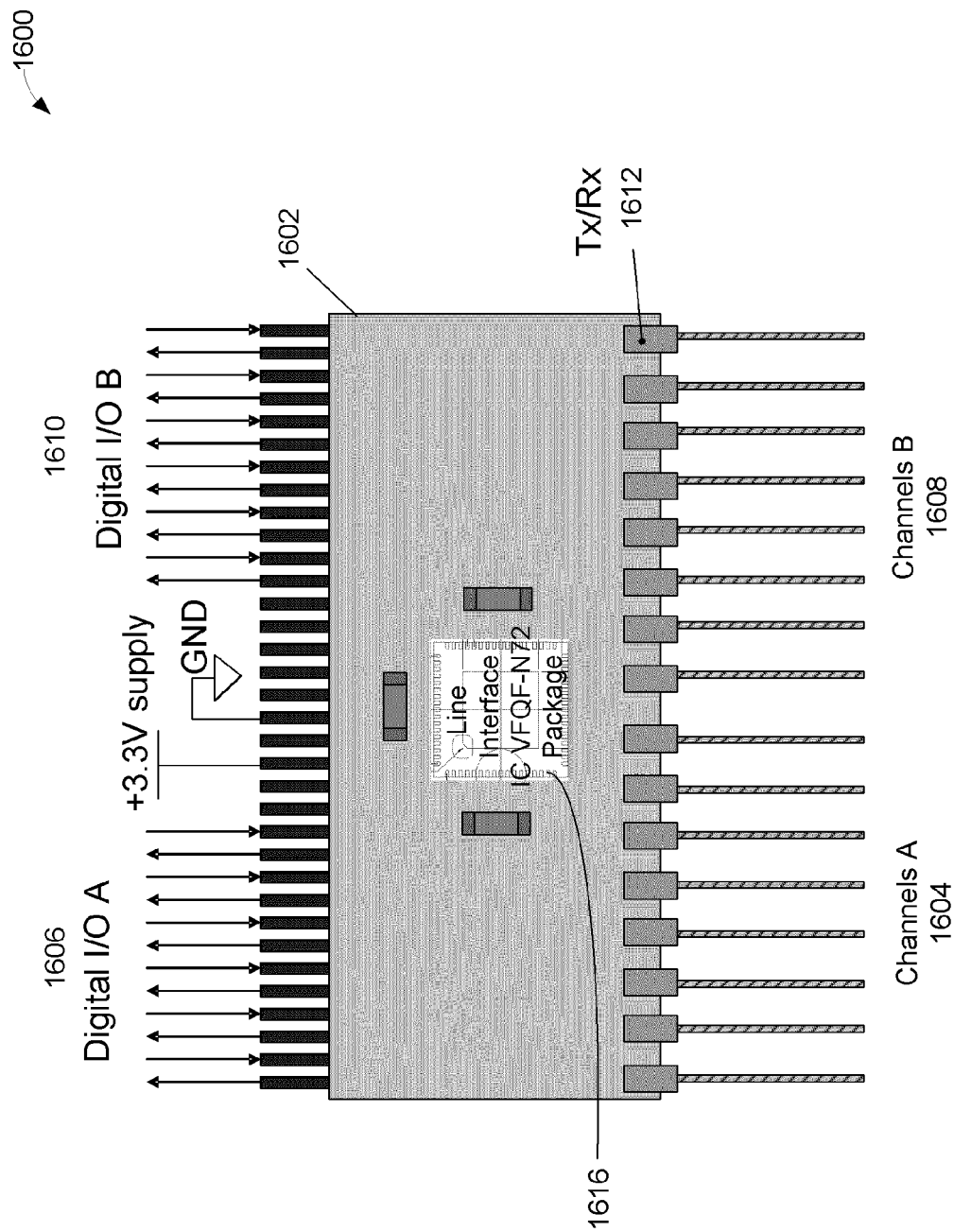
FIG. 16 illustrates one embodiment of the invention showing a package.

FIG. 16 illustrates, generally at 1600, one embodiment of the invention. At 1602 is a single package communications interface block which has eight Channels A 1604 (optical cable shown), eight Channels B 1608 (optical cables shown) and respective outputs Digital I/O A 1606 and Digital I/O B 1610. As illustrated Digital I/O A 1606 and Digital I/O B 1610 have six groups each of I/O. If Channels A 1604 and Channels B 1608 are configured as Tx/Rx pairs then Digital I/O A 1606 and Digital I/O B 1610 have two extra I/O groups that may be used, for example, to configure the communications interface block 1602 or for other signaling functions or status. Also shown is a supply (+3.3V) and ground GND. Communications interface block 1602 has among other things optical transmitters and receivers as exemplified at 1612 and a Line Interface 1616 (an integrated circuit), which in this embodiment is shown in a IC VFQF-N72 Package. Line interface 1616 is operatively coupled to Digital I/O A 1606 and Digital I/O B 1610 as well as optical transmitters and receivers as exemplified at 1612.

Thus a method and apparatus for active line interface isolation have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
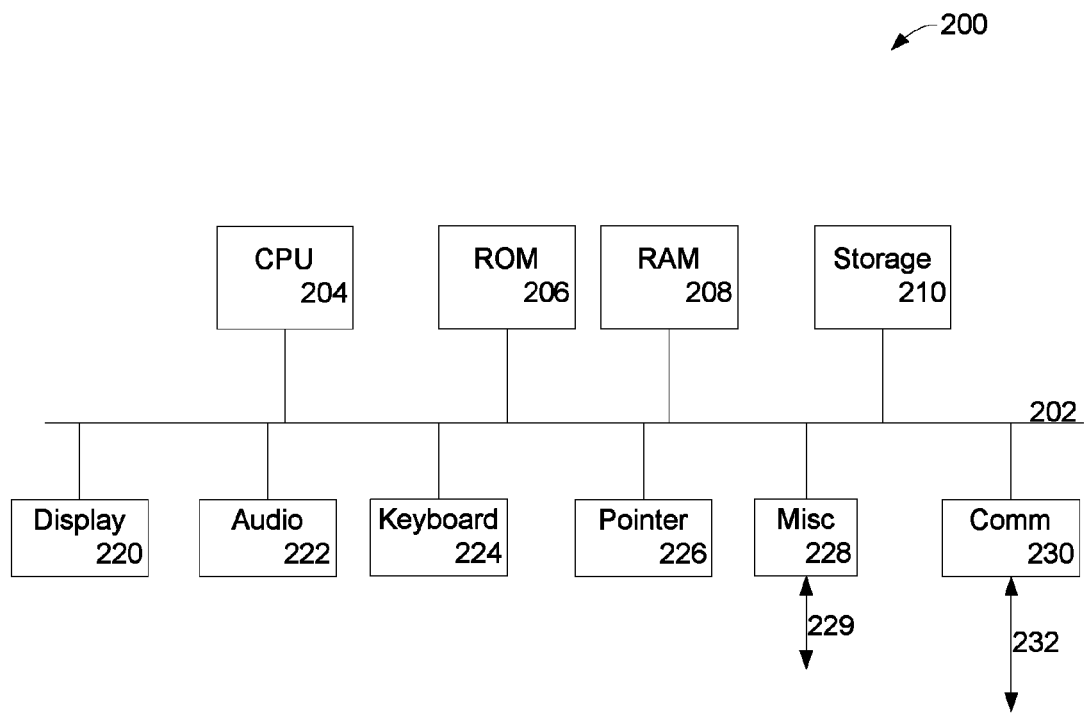
FIG. 2 is a block diagram of a computer system in which some embodiments of the invention may be used.
Figure 3:
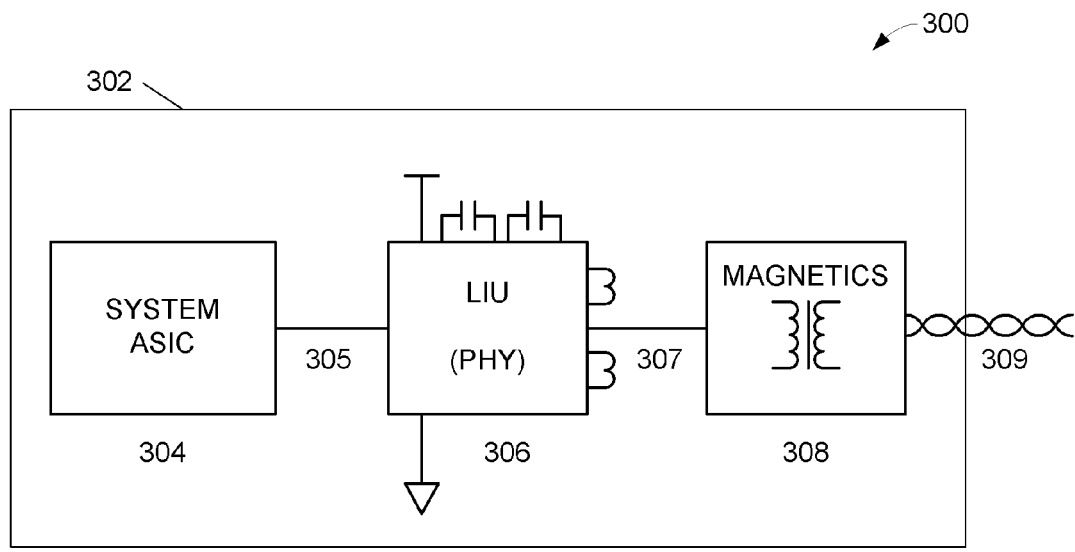
FIG. 3 illustrates a current approach.
Figure 4:
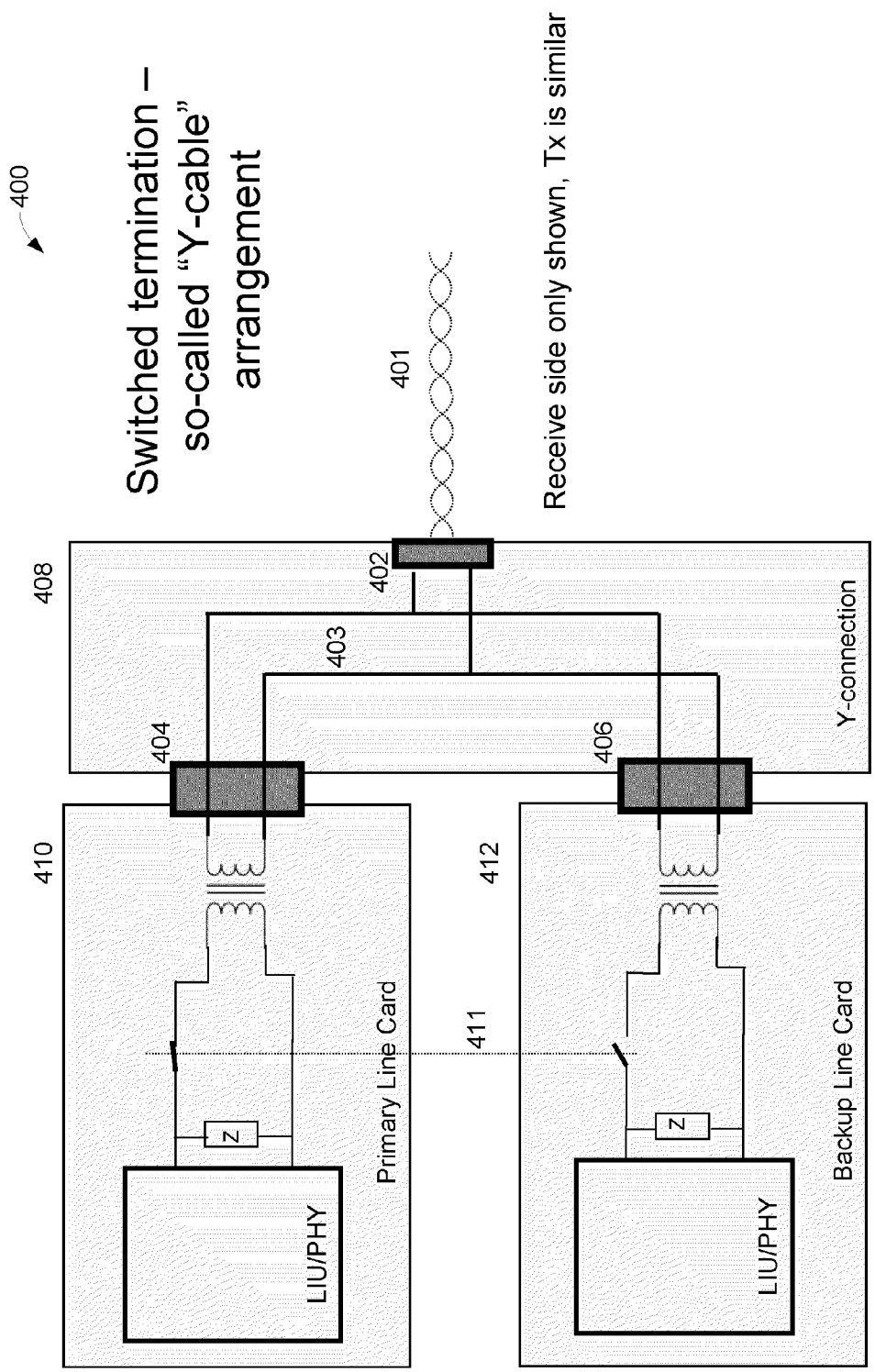
FIG. 4 illustrates a current approach to Y arrangement.
Figure 5:
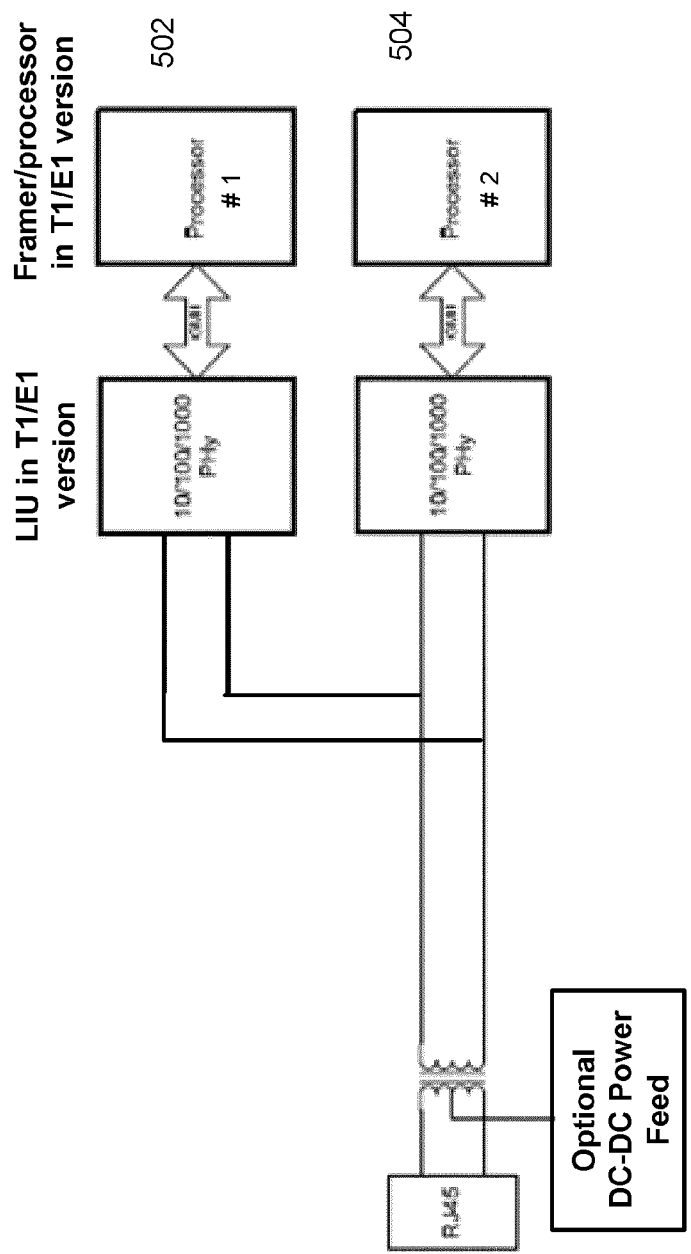
FIG. 5 illustrates a current approach to redundancy.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), PCI Express (PCI-E, PCIe), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very very close or similar. Since two physical entities can never be exactly equal, a phrase such as "substantially equal" is used to indicate that they are for all practical purposes equal.

It is to be understood that in any one or more embodiments of the invention where alternative approaches or techniques are discussed that any and all such combinations as may be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

As used in this description, "twisted pair" or "cable" or similar phrases was used to illustrate a possible embodiment for a communications channel. These terms are not limited to a wire or group of wires. For example the communications channel may be wireless, optical, etc. What is to be understood is that the terms refer to a communications channel. Also for clarity of explanation, sometimes a single "twisted pair" is shown, however, multiple pairs are possible. For example, in many communication channels there is both a transmit "pair" and a receive "pair", as well as multiple groups of transmit/receive channels. One of skill in the art understands this.

As used herein, the terms "comprising" and "containing" shall be understood to have a broad meaning similar to the term "including" and will be understood to be non-exhaustive and imply the inclusion of a stated integer or step or group of integers or steps but not the exclusion of any other integer or step or group of integers or steps. This definition also applies to variations on the terms "comprising" and containing" such as "comprise", "comprises"; "contain" and contains".

Thus a method and apparatus for active line interface isolation have been described.

What is claimed is:

1. An apparatus comprising:
   a first unit having a back side and a connection side, said back side fixedly attached to a substrate, said substrate having connection points;
   a spacer having a first side and a second side, said first side fixedly attached to said first unit connection side;
   a second unit having a back side and a connection side, said back side fixedly attached to said spacer second side;
   a first wire having a proximate end and a distal end, wherein said first wire proximate end is attached to one of said substrate connection points and said first wire distal end is attached to said first unit connection side;
   a second wire having a proximate end and a distal end, wherein said second wire proximate end is attached to said first unit connection side and said second wire distal end is attached to said second unit connection side; and
   a third wire having a proximate end and a distal end, wherein said third wire proximate end is attached to said second unit connection side and said third wire distal end is attached to said one of said substrate connection points.

2. The apparatus of claim 1 wherein said first wire, said second wire, and said third wire are a single electrical node.

3. A method comprising:
   mounting a first unit having a plurality of connection pads on a substrate having a plurality of connection pads;
   mounting on said first unit a spacer; and
   mounting on said spacer a second unit having a plurality of connection pads and wherein said first unit and said second unit are redundant units;
   creating a first connection from a one of said plurality of connection pads on said substrate to a one of said plurality of connection pads on said first unit;
   creating a second connection from said one of said plurality of connection pads on said first unit to a one of said plurality of connection pads on said second unit; and
   creating a third connection from said one of said plurality of connection pads on said second unit to said one of said plurality of connection pads on said substrate.

\* \* \* \* \*